United States Patent
Xu et al.

(10) Patent No.: US 11,581,503 B2
(45) Date of Patent: Feb. 14, 2023

(54) LIGHT-EMITTING DIODE AND METHOD FOR PREPARING THE SAME

(71) Applicants: BEIJING BOE DISPLAY TECHNOLOGY CO., LTD., Beijing (CN); BOE TECHNOLOGY GROUP CO., LTD., Beijing (CN)

(72) Inventors: Ruipeng Xu, Beijing (CN); Lifu Wang, Beijing (CN); Yanping Wang, Beijing (CN); Peng Zhou, Beijing (CN)

(73) Assignees: BEIJING BOE DISPLAY TECHNOLOGY CO., LTD., Beijing (CN); BOE TECHNOLOGY GROUP CO.. LTD., Beijing (CN)

( * ) Notice: Subject to any disclaimer, the term of this patent is extended or adjusted under 35 U.S.C. 154(b) by 84 days.

(21) Appl. No.: 17/212,020

(22) Filed: Mar. 25, 2021

(65) Prior Publication Data
US 2021/0210710 A1    Jul. 8, 2021

Related U.S. Application Data

(62) Division of application No. 16/413,832, filed on May 16, 2019, now Pat. No. 10,998,517.

(30) Foreign Application Priority Data

Aug. 1, 2018 (CN) .......................... 201810861608.1

(51) Int. Cl.
*H01L 51/50* (2006.01)
*H01L 51/00* (2006.01)
(Continued)

(52) U.S. Cl.
CPC ........ *H01L 51/5032* (2013.01); *H01L 51/001* (2013.01); *H01L 51/0007* (2013.01);
(Continued)

(58) Field of Classification Search
CPC ............. H01L 51/5032; H01L 51/0007; H01L 51/001; H01L 51/0028; H01L 51/5056;
(Continued)

(56) References Cited

U.S. PATENT DOCUMENTS

2016/0372674 A1* 12/2016 Nakano ............... H01L 51/0047
2017/0358759 A1* 12/2017 Lee ....................... H01L 31/032
(Continued)

FOREIGN PATENT DOCUMENTS

| CN | 105336856 A | 2/2016 |
|---|---|---|
| CN | 105609652 A | 5/2016 |

(Continued)

OTHER PUBLICATIONS

First Office Action for Chinese Application No. 201810861608.1, dated Sep. 5, 2019, 7 Pages.
(Continued)

*Primary Examiner* — Kyoung Lee
*Assistant Examiner* — Christina A Sylvia
(74) *Attorney, Agent, or Firm* — Brooks Kushman P.C.

(57) ABSTRACT

Provided is a light-emitting diode and a method for preparing the same. The light-emitting diode includes an anode, a hole transport layer, a perovskite light-emitting layer, an electron transport layer and a cathode stacked in sequence,
(Continued)

in which the perovskite light-emitting layer includes a first sublayer and a second sublayer stacked in sequence, with a material for forming the first sublayer including an inorganic perovskite material, and with a material for forming the second sublayer being an organic perovskite material.

11 Claims, 4 Drawing Sheets

(51) Int. Cl.
*H01L 51/52* (2006.01)
*H01L 51/56* (2006.01)

(52) U.S. Cl.
CPC ...... *H01L 51/0028* (2013.01); *H01L 51/5056* (2013.01); *H01L 51/5072* (2013.01); *H01L 51/5088* (2013.01); *H01L 51/5096* (2013.01); *H01L 51/5206* (2013.01); *H01L 51/5221* (2013.01); *H01L 51/56* (2013.01); *H01L 51/004* (2013.01); *H01L 51/0061* (2013.01); *H01L 51/0072* (2013.01); *H01L 51/0077* (2013.01); *H01L 2251/301* (2013.01); *H01L 2251/308* (2013.01); *H01L 2251/556* (2013.01)

(58) Field of Classification Search
CPC ............. H01L 51/5072; H01L 51/0026; H01L 51/5012; H01L 51/504; H01L 51/5088; H01L 51/5096; H01L 51/5206; H01L 51/5221; H01L 51/56; H01L 51/004; H01L 51/0061; H01L 51/0072; H01L 51/0077; H01L 2251/301; H01L 2251/308; H01L 2251/556
See application file for complete search history.

(56) References Cited

U.S. PATENT DOCUMENTS

| | | | |
|---|---|---|---|
| 2018/0090709 A1* | 3/2018 | Meng | ................. H01L 51/0096 |
| 2018/0151814 A1 | 5/2018 | Hirose et al. | |
| 2018/0182977 A1* | 6/2018 | Hirose | ................ H01L 51/5012 |
| 2019/0036030 A1 | 1/2019 | Wang et al. | |

FOREIGN PATENT DOCUMENTS

| | | |
|---|---|---|
| CN | 105895803 A | 8/2016 |
| CN | 106450009 A | 2/2017 |
| CN | 107910456 A | 4/2018 |
| CN | 108183176 A | 6/2018 |

OTHER PUBLICATIONS

Ng et al., "Efficiency Enhancement by Defect Engineering in Perovskite Photovoltaic Cells Prepared Using Evaporated Pbl 2 /CH 3 NH 3 I Multilayers," J. Mater. Chem. A, May 2015, pp. 9223-9231, vol. 3 (9 Pages Total).

U.S. Office Action dated Aug. 27, 2020, U.S. Appl. No. 16/413,832, 21 Pages.

Wang et al., "Interfacial Control Toward Efficient and Low-Voltage Perovskite Light-Emitting Diodes," Advanced Materials, Feb. 20115, pp. 2311-2316, vol. 27 (6 Pages Total).

* cited by examiner

LIGHT-EMITTING DIODE AND METHOD FOR PREPARING THE SAME

CROSS-REFERENCE TO RELATED APPLICATIONS

This application is a divisional of U.S. patent application Ser. No. 16/413,832 filed May 16, 2019, which claims priority to Chinese Patent Application No. 201810861608.1 filed on Aug. 1, 2018, which are incorporated herein by reference in their entireties.

TECHNICAL FIELD

The disclosure relates to the field of an organic semiconductor device, and in particular, to a light-emitting diode and a method for preparing the same.

BACKGROUND

The organic-inorganic hybrid perovskite material has the advantages of an organic semiconductor and an inorganic semiconductor. For example, the preparation process is simple, and a flexible device can be manufactured; it has high carrier mobility and a certain thermal stability. Moreover, the perovskite material is strong in light emitting, has a high light-emitting color and a narrow light absorption layer (having a half-height width of about 20 nm), and thus it is not only an excellent photovoltaic material, but also applicable to the fields of electroluminescence and photoluminescence. As compared with conventional inorganic light-emitting diodes (LED), a perovskite light-emitting diode can prepare a perovskite light-emitting layer by a solution process, thereby greatly reducing the manufacturing cost; and has a higher light-emitting purity than an organic light-emitting diode (OLED), and the color of the luminescence can be adjusted directly by a simple process. Although organic and inorganic hybrid perovskite materials have so many excellent properties, their exciton binding energy is relatively low (less than 2.0 eV) and carrier mobility is too high (8 cm$^2$/Vs), such that luminescence quenching is likely to occur when it is applied into electroluminescent devices.

SUMMARY

In a first aspect of the present disclosure, the present disclosure provides a light-emitting diode, including an anode, a hole transport layer, a perovskite light-emitting layer, an electron transport layer and a cathode stacked in sequence, in which the perovskite light-emitting layer includes a first sublayer and a second sublayer stacked in sequence, and in which a material for forming the first sublayer includes an inorganic perovskite material, and a material for forming the second sublayer is an organic perovskite material.

In a light emitting diode according to an embodiment of the present disclosure, the inorganic perovskite material includes at least one selected from lead bromide, lead chloride, and lead iodide.

In a light emitting diode according to an embodiment of the present disclosure, the material for forming the first sublayer further includes a passivation material, and the passivation material includes at least one selected from polyethylene oxide, polymethyl methacrylate, polyvinyl chloride, polystyrene, polycarbonate, acrylonitrile-butadiene-styrene copolymer, and cellulose acetate.

In a light emitting diode according to an embodiment of the present disclosure, the first sublayer is formed by a solution process.

In a light emitting diode according to an embodiment of the present disclosure, the organic perovskite material includes at least one selected from methyl ammonium bromide, methyl ammonium chloride, methyl ammonium iodide, ethyl ammonium bromide, ethyl ammonium chloride, ethyl ammonium iodide, formamidine hydrochloride, formamidine hydrobromide and formamidine hydroiodide.

In a light emitting diode according to an embodiment of the present disclosure, the second sublayer is formed by a vacuum evaporation process.

In a light emitting diode according to an embodiment of the present disclosure, a thickness of the first sublayer and a thickness of the second sublayer are each independently 5 nm to 100 nm.

In a light emitting diode according to an embodiment of the present disclosure, the first sublayer is formed of lead bromide doped with polyethylene oxide (PEO), and the second sublayer is formed of methyl ammonium bromide.

In a light emitting diode according to an embodiment of the present disclosure, the light-emitting diode further includes an exciton-blocking layer and a hole injection layer, with the exciton-blocking layer being arranged between the perovskite light-emitting layer and the electron transport layer, and with the hole injection layer being arranged between the hole transport layer and the anode; and in which the anode is formed of indium tin oxide, the hole injection layer is formed of 2,3,6,7,10,11-hexacyano-1,4,5,8,9,12-hexaazatriphenylene (HAT-CN), the hole transport layer is formed of 4,4',4"-tris(carbazol-9-yl)triphenylamine (TCTA), the first sublayer is formed of PEO-doped lead bromide, the second sublayer is formed of methyl ammonium bromide, the exciton-blocking layer is formed of bathocuproine (BCP), the electron transport layer is formed of 1,3,5-tris(1-phenyl-1H-benzimidazol-2-yl)benzene (TPBi), and the cathode is formed of a magnesium-silver alloy.

In a second aspect of the present disclosure, the present disclosure provides a method of preparing a light-emitting diode, including: forming a hole transport layer on a side of the anode; forming a perovskite light-emitting layer on a side of the hole transport layer away from the anode; forming an electron transport layer on a side of the perovskite light-emitting layer away from the anode; and forming a cathode on a side of the electron transport layer away from the anode.

The forming the perovskite light-emitting layer includes: forming a first sublayer on a side of the hole transport layer away from the anode, with a raw material for forming the first sublayer including an inorganic perovskite material; and forming a second sublayer on a side of the first sublayer away from the anode, with a raw material for forming the second sublayer being an organic perovskite material.

In the preparation method according to an embodiment of the present disclosure, the first sublayer is formed by a solution process and the second sublayer is formed by a vacuum evaporation process.

In the preparation method according to an embodiment of the present disclosure, a raw material for forming the first sublayer by the solution process further includes a passivation material and a solvent, with the solvent including at least one selected from dimethyl sulfoxide and dimethylformamide.

In the preparation method according to an embodiment of the present disclosure, the weight ratio of the inorganic perovskite material to the passivation material is from 19:1 to 4:1.

In the preparation method according to an embodiment of the present disclosure, the forming the perovskite light-emitting layer further includes: annealing the first sublayer at 70 to 200° C. after the forming the first sublayer.

In the preparation method according to an embodiment of the present disclosure, the method further includes forming a hole injection layer on the side of the anode before the forming the hole transport layer.

In the preparation method according to an embodiment of the present disclosure, the method further includes forming an exciton-blocking layer on the side of the perovskite light-emitting layer before the forming the electron transport layer.

DETAILED DESCRIPTION

Embodiments of the present disclosure will be described in detail below. A person skilled in the art will appreciate that the following embodiments are intended to be illustrative of the present disclosure, and are not to be construed as limiting to the present disclosure. Unless specifically stated otherwise, specific techniques or conditions are not explicitly described in the following embodiments, and a person skilled in the art can follow the techniques or conditions commonly used in the art or in accordance with the relevant product description.

The present disclosure has been completed based on the following findings of the inventors. In the research process of the inventors of the present disclosure, it was found that the luminescence spectrum of the related organic and inorganic hybrid perovskite materials has a narrow half-height width and a high color purity, and has great prospects in the future display devices, but their exciton binding energy is relatively low (less than 2.0 eV) and carrier mobility is too high (8 cm$^2$/Vs), such that luminescence quenching is likely to occur when it is applied into electroluminescent devices, and thus the inventors prepared the perovskite light-emitting layer into an inorganic first sublayer and an organic second sublayer, so as to reduce the carrier mobility of the light-emitting layer, reduce the luminescence quenching phenomenon in the device, and further improve the luminance and luminous efficiency of the device.

In one aspect of the present disclosure, the present disclosure provides a light-emitting diode, including an anode, a hole transport layer, a perovskite light-emitting layer, an electron transport layer and a cathode stacked in sequence, in which the perovskite light-emitting layer includes a first sublayer and a second sublayer stacked in sequence, with a material for forming the first sublayer including an inorganic perovskite material, and with a material for forming the second sublayer being an organic perovskite material.

Figure 1:
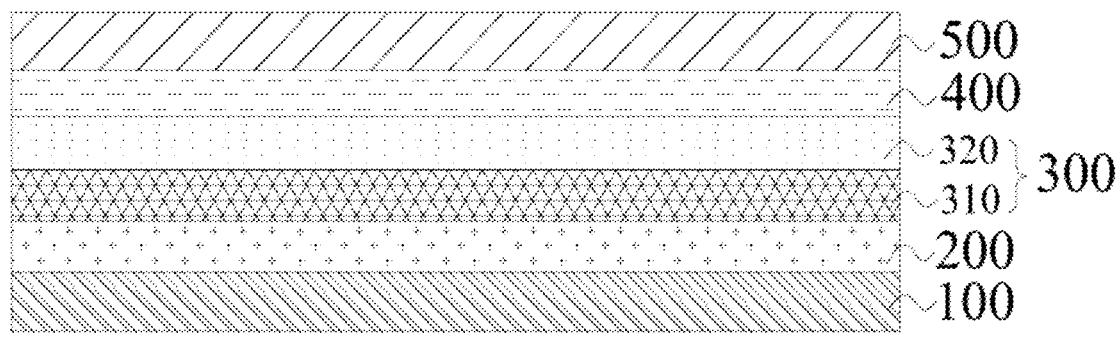
FIG. 1 is a schematic cross-sectional view of a light-emitting diode according to one embodiment of the present disclosure.

As shown in FIG. 1, a light-emitting diode according to an embodiment of the present disclosure includes an anode 100, a hole transport layer 200, a perovskite light-emitting layer 300, an electron transport layer 400, and a cathode 500 stacked in sequence. The perovskite light-emitting layer 300 includes a first sublayer 310 and a second sublayer 320 stacked in sequence, with a material for forming the first sublayer 310 including an inorganic perovskite material, and with a material for forming the second sublayer 320 being an organic perovskite material.

In the researches of the related art, Tan et al. used $CH_3NH_3PbI_3$—XClX and $CH_3NH_3PbBr_3$ as the light-emitting active layers, respectively; used $TiO_2$ and $F_8$ as the materials for the electron injection layer and the hole transport layer, respectively; and prepared a perovskite electroluminescent device of infrared visible light band at room temperature. The highest external quantum efficiencies of these two electroluminescent devices were 0.76% and 0.1%. Subsequently, H. Chao et al. achieved perovskite's light emitting of various colors and increased the maximum luminous efficiency to 0.125%. Since then, changes in carrier injection and transport materials have been investigated to optimize the energy band of electroluminescent devices. In addition, the perovskite light-emitting layer of the perovskite LED is arranged between the electron transport layer and the hole transport layer, and the function of light emission is realized by injection of carriers, but it is found that the luminous efficiency of the device is less than 1% due to serious light quenching or carrier imbalance. Thereafter, Wang et al. achieved a luminous efficiency of up to 3.5% for perovskite LED by surfacely modifying zinc oxide as an electron transport layer by polyetherimide (PEI), and by using a blend of 4,4',4"-tris(carbazol-9-yl)triphenylamine (TCTA) and poly(9,9-dioctylfluorene-co-N-(4-butylphenyl)diphenylamine) (TFB) as a hole transport layer. The study also found that fluorescence quenching occurs in the formation of metal lead atoms. Thereafter, Cho et al. of South Korea prevented the formation of metal lead atoms and restricted the exciton space to the perovskite nanocrystals at a same time by appropriately increasing the ratio of methyl ammonium bromide. Both methods greatly improved the steady-state luminous intensity and the luminous efficiency of the perovskite nanocrystalline layer, to 8.5%. Therefore, the related organic-inorganic hybrid perovskite material has a relatively high fluorescence quantum efficiency in nature, which also allows the perovskite LED to have a large space for development.

In the course of studying the present disclosure, the inventors found, in the light-emitting diode of the embodiment of the present disclosure, the perovskite light-emitting layer is arranged as a inorganic first sublayer and an organic second sublayer stacked, so as to reduce the carrier mobility of the light-emitting layer, reduce the luminescence quenching phenomenon in the device, and further improve the luminance and luminous efficiency of the device.

According to an embodiment of the present disclosure, the inorganic perovskite material optionally includes at least one selected from lead bromide ($PbBr_2$), lead chloride ($PbCl_2$), and lead iodide ($PbI_2$). The perovskite light-emitting layer includes a first sublayer 310 formed of the above inorganic materials, which allow the device to have a higher luminous efficiency. In some embodiments of the present disclosure, the inorganic perovskite material may be selected to be lead bromide ($PbBr_2$). This is because lead bromide allows the device to have a higher luminous efficiency, and the inorganic materials has a better stability and a lower cost.

In some embodiments of the present disclosure, the material for forming the first sublayer 310 may also include a passivation material. Optionally, the passivation material may include at least one selected from polyethylene oxide (PEO), polymethyl methacrylate (PMMA), polyvinyl chloride (PVC), polystyrene (PS), polycarbonate (PC), acrylonitrile-butadiene-styrene copolymer (ABS) and cellulose acetate (CA). By adding a passivation material having a low conductivity such as PEO into the first sublayer 310, the current density in the perovskite light-emitting layer 300 can be effectively reduced, and the film forming property of the passivation material is good. Thus, the surface defects of the first sublayer 310 can be remarkably reduced, and the luminance of the device can be remarkably improved.

In some specific embodiments, the first sublayer 310 can be formed by a solution process. Preparing the perovskite light-emitting layer by using an inorganic material such as lead bromide, lead chloride or lead iodide or together with a passivation material having a low conductivity as raw material can reduce the surface defects of the first sublayer 310 formed by a solution process, and further enhance the luminance of the device.

According to an embodiment of the present disclosure, the organic perovskite material includes at least one selected from methyl ammonium bromide ($CH_3NH_3Br$), methyl ammonium chloride ($CH_3NH_3Cl$), methyl ammonium iodide ($CH_3NH_3I$), ethyl ammonium bromide ($CH_3CH_2NH_3Br$), ethyl ammonium chloride ($CH_3CH_2NH_3Cl$), ethyl ammonium iodide ($CH_3CH_2NH_3I$), formamidine hydrochloride ($HC(NH_2)_2Cl$), formamidine hydrobromide ($HC(NH_2)_2Br$) and formamidine hydroiodide ($HC(NH_2)_2I$). The perovskite light-emitting layer includes a second sublayer 320 formed of the above-described organic perovskite material, which allow the device to have a higher luminous efficiency. In some embodiments of the present disclosure, the organic perovskite material may be selected to be methyl ammonium bromide ($CH_3NH_3Br$). The organic material allows the device to have higher luminous efficiency, and the organic perovskite material has a better stability and a lower cost.

According to an embodiment of the present disclosure, the second sublayer 320 may be formed by a vacuum evaporation process, for example, an evaporation process of vacuum thermal evaporation. Forming the perovskite light-emitting layer by using an organic perovskite material such as methyl ammonium bromide as a raw material can allow a second sublayer 320 having a better flatness and uniformity by vapor deposition process. Thus, the leakage current problem of the device is further reduced, thereby further improving the current efficiency of the device.

According to an embodiment of the present disclosure, the first sublayer 310 may have a thickness of 5 nm to 100 nm. Optionally, the second sublayer 320 may have a thickness of 5 nm to 100 nm. This thickness setting may allow the perovskite light-emitting layer 300 to have a higher luminance. If the thickness of the first sublayer 310 or the second sublayer 320 is less than 5 nm, the luminance of the perovskite light-emitting layer 300 is too low to achieve a display effect; and if the thickness of the first sublayer 310 or the second sublayer 320 is greater than 100 nm, the luminance of the perovskite light-emitting layer 300 will not increase too much, but will increase the energy consumption of the device.

Figure 2:
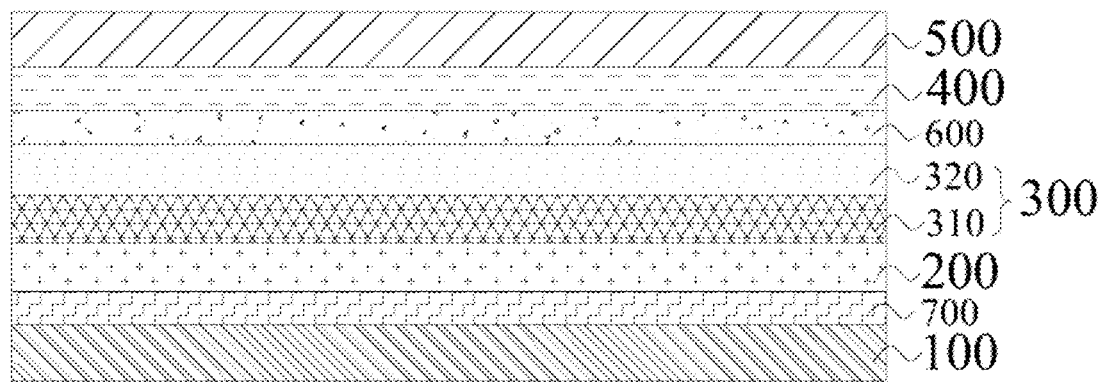
FIG. 2 is a schematic cross-sectional view of a light-emitting diode according to another embodiment of the present disclosure.

According to an embodiment of the present disclosure, referring to FIG. 2, the perovskite light-emitting diode may further include an exciton-blocking layer 600 and a hole injection layer 700. The exciton-blocking layer 600 may be arranged between the perovskite light-emitting layer 300 and the electron transport layer 400. The hole injection layer 700 may be arranged between the hole transport layer 200 and the anode 100. The exciton-blocking layer 600 can further enhance the luminous efficiency of the white light-emitting diode, and the hole injection layer 700 can also improve the luminous efficiency of the device, prolong the luminous efficiency of the device, or reduce the voltage of the light emitting, thereby obtaining a light-emitting diode having further improved structure and function.

According to an embodiment of the present disclosure, the material for forming the anode 100 may be an anode material commonly used in the art, such as indium tin oxide (ITO), as long as the sheet resistance of the anode 100 of the material is less than 30Ω. It can be selected by a person skilled in the art according to the specific photoelectric performance and the light-emitting direction of the light-emitting diode, which will not be described here. According to an embodiment of the present disclosure, the thickness of the anode 100 is not particularly limited, for example, 50 nm, 80 nm, or 100 nm. It can be designed and adjusted by a person skilled in the art according to the actual light-emitting voltage requirement of the perovskite light-emitting diode, which will not be described here.

According to an embodiment of the present disclosure, the material for forming the hole injection layer 700 may be an electron transport material commonly used in the art, for example, an organic small molecule material, a high molecular polymer such as PEDOT:PSS, or a metal oxide material having a melting point (Tg) greater than 100° C., such as $MoO_3$. It can be selected by a person skilled in the art according to the photoelectric performance of the light-emitting diode. In some embodiments of the present disclosure, the hole injection layer 700 may select 2,3,6,7,10,11-hexacyano-1,4,5,8,9,12-hexaazatriphenylene (HAT-CN). The hole injection layer 700 is made of a material having a strong electron-withdrawing ability, and may remarkably improve the hole injection efficiency, thereby increasing the current density of the device.

According to an embodiment of the present disclosure, the material for forming the hole transport layer 200 may be an organic small molecule material, a high molecular polymer such as poly[diphenyl-N,N'-bis(3-methylphenyl)-1,1'-biphenyl-4,4'-diamine] (Poly-TPD) or TFB, or a metal oxide material having a melting point (Tg) greater than 100° C. It can be selected by a person skilled in the art according to the specific photoelectric performance of the light-emitting diode. In some embodiments of the present disclosure, the hole transport layer 200 may use 4,4',4"-tris(carbazol-9-yl)triphenylamine (TCTA). The hole transport layer 200 uses a material having a higher hole mobility, which can significantly improve the hole injection efficiency, thereby increasing the current density of the device.

According to the embodiment of the present disclosure, the thicknesses of the hole injection layer 700 and the hole transport layer 200 are not particularly limited, and can be designed and adjusted by a person skilled in the art can according to the specific material for forming the layer and the actual light-emitting performance of the perovskite light-emitting diode, which will not be described here.

According to an embodiment of the present disclosure, the material for forming the exciton-blocking layer 600 may be an organic small molecule material, for example, bathocuproine (2,9-Dimethyl-4,7-diphenyl-1,10-phenanthroline, BCP), etc. It can be selected by a person skilled in the art according to the specific material type of the light-emitting layer and the specific material type of the electron transport layer 400, which will not be described here. According to an embodiment of the present disclosure, the thickness of the exciton-blocking layer 600 is not particularly limited, and can be adjusted by a person skilled in the art according to the specific material of the exciton-blocking layer 600 and the actual luminous efficiency of the perovskite light-emitting diode, which will not be described here.

According to an embodiment of the present disclosure, the material for forming the electron transport layer 400 may be an organic small molecule material, for example, 1,3,5-tris(1-phenyl-1H-benzimidazol-2-yl)benzene (TPBi). It can be selected by a person skilled in the art according to the actual light-emitting performance of the perovskite light-emitting diode, which will not be described here. According to an embodiment of the present disclosure, the specific thickness of the electron transport layer 400 is not particularly limited, and can be selected by a person skilled in the art according to the specific material of the electron transport layer 400 and the actual light-emitting performance of the perovskite light-emitting diode, which will not be described here.

According to an embodiment of the present disclosure, the material for forming the cathode 500 may be a metal material such as, a magnesium-silver alloy. It can be selected by a person skilled in the art according to the specific photoelectric performance and the light-emitting direction of the light-emitting diode, which will not be described here. According to an embodiment of the present disclosure, the specific thickness of the cathode 500 is not particularly limited, and can be designed and adjusted by a person skilled in the art according to the actual light-emitting voltage requirement of the perovskite light-emitting diode, which will not be described here.

Figure 3:
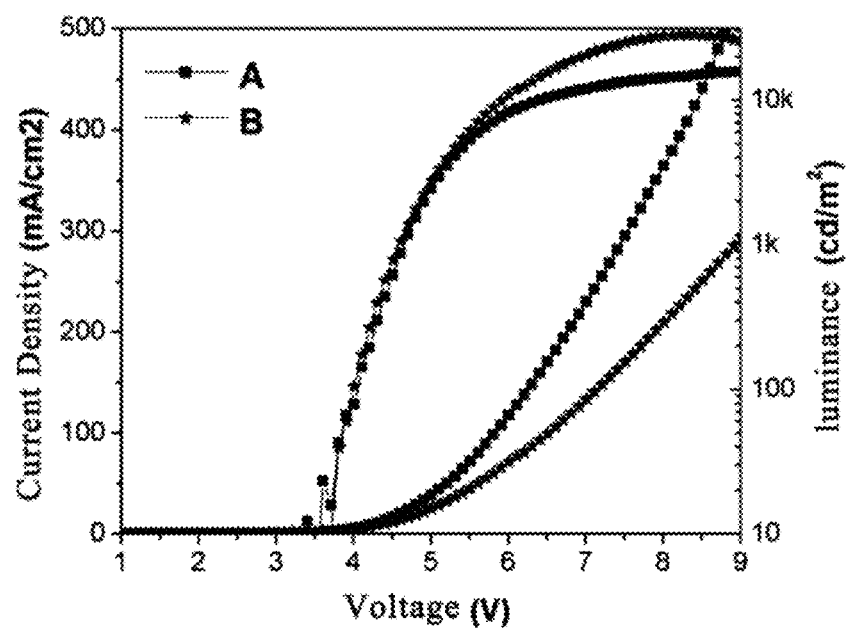
FIG. 3 is a characteristic curve of current density, voltage and luminance of a light-emitting diode according to two embodiments of the present disclosure.
Figure 4:
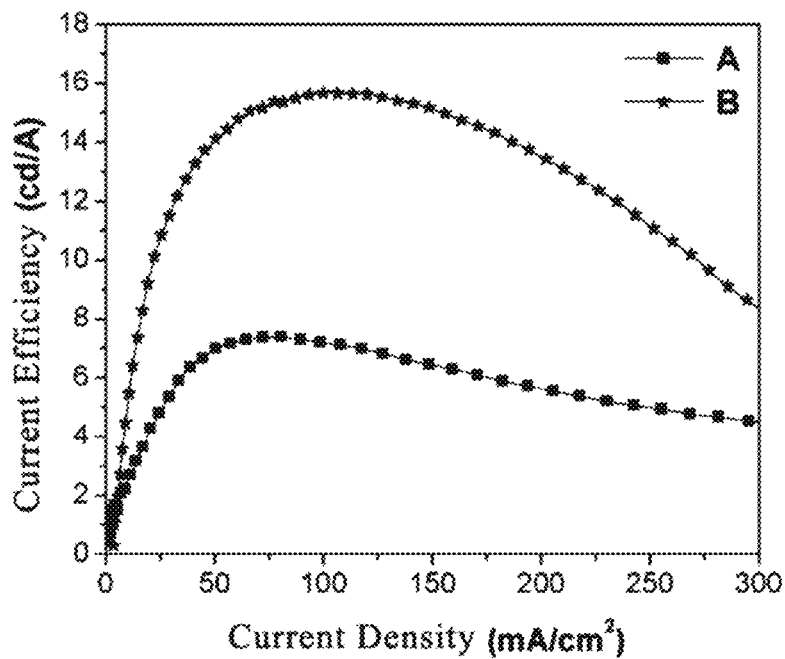
FIG. 4 is a characteristic curve of current efficiency and current density of a light-emitting diode according to two embodiments of the present disclosure.

In some embodiments of the present disclosure, the anode 100 is made of ITO, the hole injection layer 700 is made of HAT-CN, the hole transport layer 200 is made of TCTA, the first sublayer 310 is made of lead bromide, the second sublayer 320 is made of methyl ammonium bromide, the exciton barrier layer 600 is made of BCP, the electron transport layer 400 is made of TPBi, and cathode 500 is made of a magnesium-silver alloy. Referring to curve A in FIG. 3, the light-emitting diode has a current density of up to 360 mA/cm$^2$ at a light-emitting voltage of 8 V and a luminance of up to 15,000 cd/m$^2$; and referring to curve A in FIG. 4, the maximum current efficiency of the light-emitting diode can reach up to 7 cd/A.

In another embodiment of the present disclosure, the anode 100 is made of ITO, the hole injection layer 700 is made of HAT-CN, the hole transport layer 200 is made of TCTA, the first sublayer 310 is made of PEO-doped lead bromide, the second sublayer 320 is made of methyl ammonium bromide, the exciton barrier layer 600 is made of BCP, the electron transport layer 400 is made of TPBi, and cathode 500 is made of a magnesium-silver alloy. Referring to curve B in FIG. 3, the light-emitting diode has a current density of up to only 200 mA/cm$^2$ at a light-emitting voltage of 8 V but a luminance of up to 28,000 cd/m$^2$; and referring to curve B in FIG. 4, the maximum current efficiency of the light-emitting diode can reach 16 cd/A.

A comprehensive comparison shows that doping a low-conductivity passivation material into an inorganic perovskite material reduces the current density, but can effectively reduce the surface defects of the first sublayer 310, significantly reduce the non-radiative recombination resulting in the surface defects in the device, and further enhance the luminous efficiency of the device.

Therefore, according to the light-emitting diode in an embodiment of the present disclosure, the perovskite light-emitting layer includes the inorganic first sublayer and the organic second sublayer stacked, so as to reduce the carrier mobility of the light-emitting layer, reduce the luminescence quenching phenomenon in the device, and further improve the luminance and luminous efficiency of the device.

Figure 5:
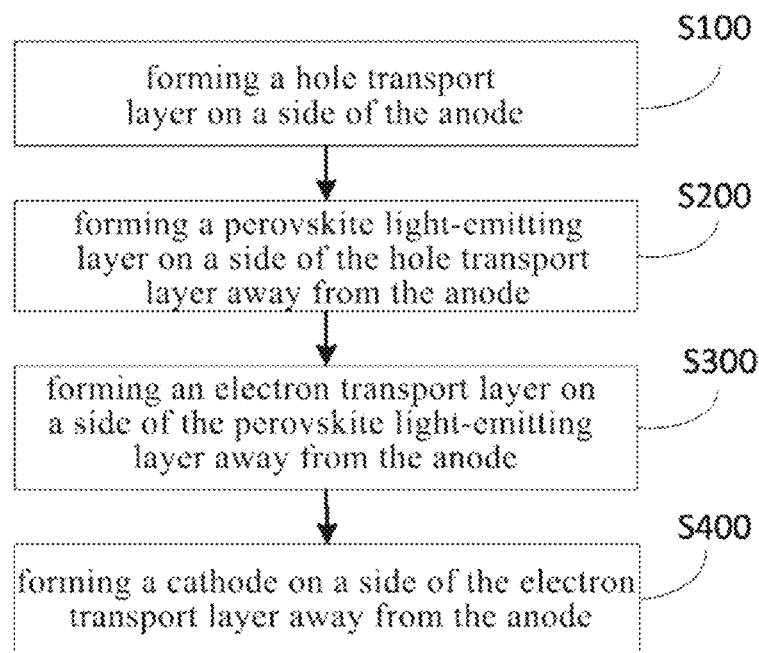
FIG. 5 is a schematic flow chart of a method for preparing a light-emitting diode according to an embodiment of the present disclosure.

In another aspect of the present disclosure, the present disclosure provides a method for preparing a light-emitting diode, as shown in FIG. 5, including the following steps.

S100: forming a hole transport layer on a side of the anode.

In this step, a hole transport layer 200 was formed on a side of the anode 100. In some embodiments of the present disclosure, a hole transport layer 200 of a TCTA material was formed on a glass substrate having a 100 nm thick layer of ITO material as the anode 100. According to the embodiment of the present disclosure, the specific process for forming the hole transport layer 200 is not particularly limited, and a suitable preparation process can be selected by a person skilled in the art according to the specific material of the electron transport layer 200, which will not be described here.

Figure 6:
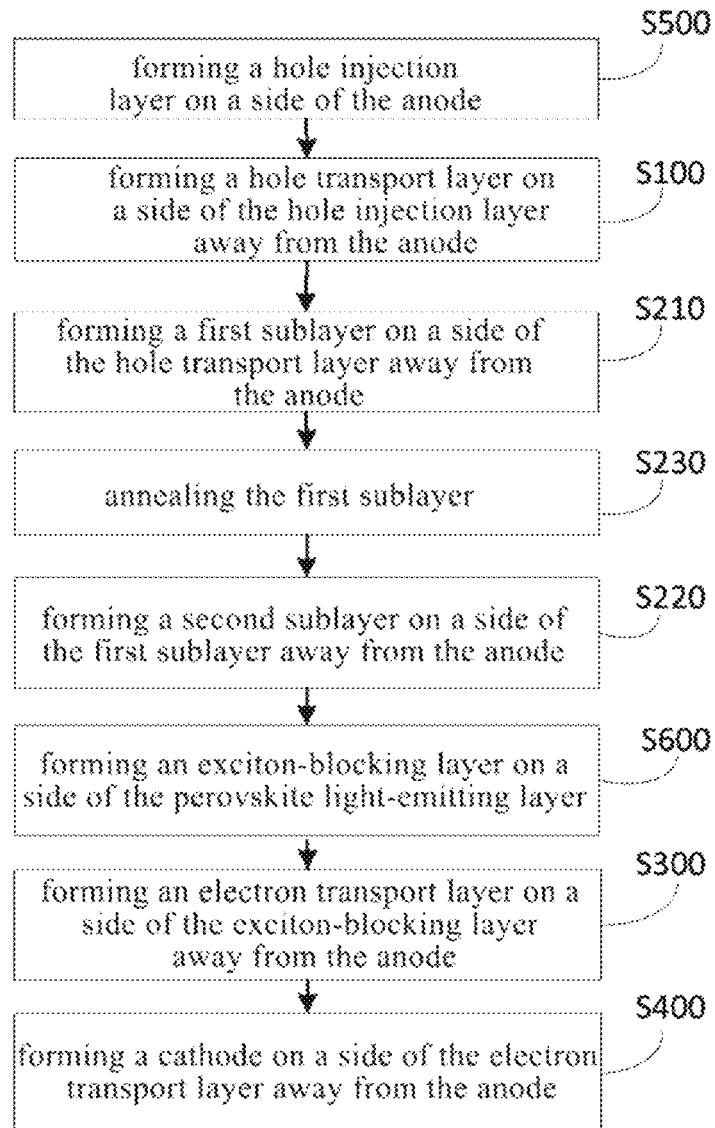
FIG. 6 is a schematic flow chart of a method for preparing a light-emitting diode according to another embodiment of the present disclosure.

In some embodiments of the present disclosure, as shown in FIG. 6, before step S100, the following step S500 may be performed in advance.

S500: forming a hole transport layer on a side of the anode.

In this step, the glass substrate with the anode 100 can be ultrasonically cleaned in deionized water, acetone, and absolute ethanol, and purged with nitrogen and subjected to the $O_2$ plasma treatment. Then a hole injection layer 700 is formed on the surface of the anode 100. Thereafter, the hole transport layer 200 is formed further on a surface of the hole injection layer 700 away from the anode 100. According to the embodiment of the present disclosure, the specific process for forming the hole injection layer 700 is not particularly limited, and a suitable preparation process can be selected by a person skilled in the art according to the specific material of the electron injection layer 700, which will not be described here.

S200: forming a perovskite light-emitting layer on a side of the hole transport layer away from the anode.

In this step, a perovskite light-emitting layer 300 is formed on a side of the hole transport layer 200 away from the anode 100. According to the embodiment of the present disclosure, the specific process for forming the perovskite light-emitting layer 300 is not particularly limited, and can be selected by a person skilled in the art according to the specific structure and material type of the perovskite light-emitting layer 300, which will not be described here.

In some embodiments of the present disclosure, as shown in FIG. 6, step S200 may include the following steps S210 to S230.

S210: forming a first sublayer on a side of the hole transport layer away from the anode.

In this step, the first sublayer 310 is formed on the surface of the hole transport layer 200 away from the anode 100, and the raw material for forming the first sublayer 310 includes an inorganic perovskite material.

According to an embodiment of the present disclosure, the inorganic perovskite material may include at least one selected from lead bromide ($PbBr_2$), lead chloride ($PbCl_2$), and lead iodide ($PbI_2$). The perovskite light-emitting layer includes a first sublayer 310 formed of the above inorganic materials, which allow the device to have a higher luminous efficiency. In some embodiments of the present disclosure, the process for forming the first sublayer 310 may be a solution process. The solution process can produce the first sublayer 310 in the perovskite light-emitting layer 300 at a lower cost and in a simple process.

In some embodiments of the present disclosure, the material for forming the first sublayer 310 may include a passivation material and a solvent in addition to the inorganic perovskite material. The passivation material may include at least one selected from polyethylene oxide (PEO), polymethyl methacrylate (PMMA), polyvinyl chloride (PVC), polystyrene (PS), polycarbonate (PC), acrylonitrile-butadiene-styrene copolymer (ABS) and cellulose acetate (CA). The solvent may include at least one selected from dimethyl sulfoxide and dimethylformamide. Since the passivation material has a better film forming property in the solution process, the surface defect of the first sublayer 310 formed can be reduced, and the luminance of the device can be remarkably improved.

According to an embodiment of the present disclosure, the weight ratio of the inorganic perovskite material to the passivation material may be from 19:1 to 4:1. The weight ratio can reduce the surface defect of the first sublayer 310 formed by the solution process, meanwhile the passivation material having a low conductivity such as PEO of the above weight ratio can effectively reduce the current density in the perovskite light-emitting layer 300. If the weight ratio of the inorganic perovskite material to the passivation material is greater than 19:1, the low concentration of the passivation material cannot significantly reduce the surface defects of the first sublayer 310; and if the weight ratio is less than 4:1, the high concentration of the passivation material will reduce the luminous efficiency of the device.

In some embodiments of the present disclosure, as shown in FIG. 6, after step S210, step S200 may further include S230 and S220.

S230: annealing the first sublayer.

In this step, the first sublayer 310 is annealed, and the annealing temperature is 70° C. to 200° C. The annealing process can smooth the surface of the first sublayer 310 away from the anode 100. This facilitates the flatness of the second sublayer 320 formed in subsequent steps, thereby increasing the current efficiency of the device.

S220: forming a second sublayer on a side of the first sublayer away from the anode.

In this step, a second sublayer 320 is formed on the side of the first sublayer 310 away from the anode 100. Optionally, the material for forming the second sublayer 320 is an organic perovskite material. In some embodiments of the present disclosure, the process for forming the second sublayer 320 may be a vacuum evaporation process. The second sublayer 320 formed is better in flatness and uniformity, thereby reducing leakage current in the device, and further increasing the current efficiency of the device.

Figure 7:
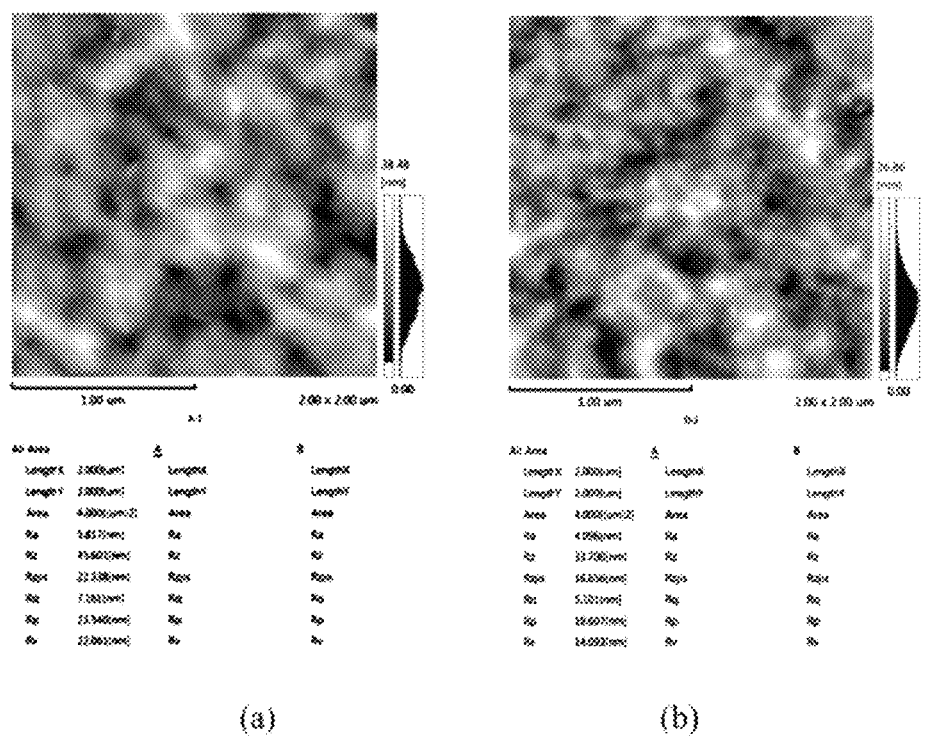
FIG. 7 is an atomic force microscope picture of a perovskite light-emitting layer according to two embodiments of the present disclosure.

In a specific embodiment, the inorganic perovskite material is selected to be lead bromide, and the organic perovskite material is selected to be ammonium methyl ammonium bromide. A perovskite light-emitting layer 300 is composed of a first sublayer 310 formed by a solution process and a second sublayer 320 formed by an evaporation process, and its surface average roughness Ra is about 5.8 nm, as shown in an atomic force microscope (AFM) photograph of FIG. 7(a).

In another example, the inorganic perovskite material is selected to be lead bromide, the passivation material is selected to be PEO, and the organic perovskite material is selected to be ammonium methyl ammonium bromide. A perovskite light-emitting layer 300 is composed of a first sublayer 310 formed by a solution process and a second sublayer 320 formed by an evaporation process, and its surface average roughness Ra is reduced to 4.1 nm, as shown in an atomic force microscope (AFM) photograph of FIG. 7(b). This indicates that doping the passivation material in the inorganic perovskite material can effectively reduce the surface defects of the perovskite light-emitting layer 300, thereby improving the luminous efficiency of the device.

In some embodiments of the present disclosure, referring to FIG. 6, after step S200, the method may further include step S600.

S600: forming an exciton-blocking layer a surface of the perovskite light-emitting layer.

In this step, an exciton-blocking layer 600 is formed on the surface of the perovskite light-emitting layer 300. According to an embodiment of the present disclosure, the specific process for forming the exciton-blocking layer 600 is not particularly limited, for example, a thermal evaporation process or the like. A suitable preparation process can be selected by a person skilled in the art according to the material of the exciton-blocking layer 600, which will not be described here.

S300: forming an electron transport layer on a side of the perovskite light-emitting layer away from the anode.

In this step, the electron transport layer 400 is formed on a side of the perovskite light-emitting layer 300 away from the anode 100. In some embodiments of the present disclosure, the electron transport layer 400 may be formed on a surface of the exciton-blocking layer 600 away from the anode 100. According to an embodiment of the present disclosure, a specific process for forming the electron transport layer 400 is not particularly limited, for example, a thermal evaporation process or the like. A suitable preparation process can be selected by a person skilled in the art according to the specific material of the electron transport layer 400, which will not be described here.

S400: forming a cathode on a side of the electron transport layer away from the anode.

In this step, the cathode 500 is formed on a side of the electron transport layer 400 away from the anode 100. According to an embodiment of the present disclosure, a specific process for forming the cathode 500 is not particularly limited, for example, a thermal evaporation process or the like. A suitable preparation process can be selected by a person skilled in the art according to the material of the cathode 500, which will not be described here.

In summary, the preparation method according to the embodiment of the present disclosure can prepare a light-emitting diode having low carrier mobility, low probability of luminescence quenching, and higher luminous efficiency in the light-emitting layer; and the preparation method is simple in process and low in cost. Those skilled in the art would understand that the features and advantages described above for the light-emitting diode are still applicable to the method for preparing the light-emitting diode, which will not be described here.

In the description of the present disclosure, it should be noted that the terms "center", "longitudinal", "transverse", "length", "width", "thickness", "upper", "lower", "front", "rear", "left", "right", "vertical", "horizontal", "top", "bottom", "inner", "outer", "clockwise", "counterclockwise", "axial", "radial", "circumferential", etc. indicating the orientation or spatial relationship is based on the orientation or spatial relationship shown in the drawings, and are merely for the convenience of describing the present disclosure and the simplification of the description, rather than indicating or implying that the referred device or element must have a particular orientation, or be constructed and operated in a particular orientation. Thus, it should not be construed as a limitation on the present disclosure.

Moreover, the terms "first" and "second" are merely used for descriptive purposes, and are not to be construed as indicating or implying a relative importance or implicitly indicating the number of technical features indicated. Thus, the features defined by "first" and "second" may include at least one of the features, either explicitly or implicitly. Unless specifically stated otherwise, in the description of the present disclosure, the meaning of "a plurality" is at least two, such as two and three.

In the description of the present specification, the terms "one embodiment", "some embodiments", "example", "specific example", "some examples" etc., means that a particular feature, structure, material, or characteristic described with reference to this embodiment or example is included in at least one embodiment or example of the present disclosure. In the present specification, the schematic representation of the above terms does not necessarily refer to the same embodiment or example. Furthermore, the specific features, structures, materials or features may be combined in any suitable manner in any one or more embodiments or examples. In addition, various embodiments or examples described in the specification and features of various embodiments or examples may be combined without departing from the scope of the invention.

Although the embodiments of the present disclosure have been shown and described above, it is understood that the foregoing embodiments are illustrative and are not to be construed as limiting to the scope of the disclosure, and various modifications, amendments, alterations and variations of the above-described embodiments can be made by a person skilled in the art within the scope of the present disclosure.

What is claimed is:

1. A method for preparing a light-emitting diode, comprising steps of:
    forming a hole transport layer on a side of an anode;
    forming a perovskite light-emitting layer on a side of the hole transport layer away from the anode;
    forming an electron transport layer on a side of the perovskite light-emitting layer away from the anode; and
    forming a cathode on a side of the electron transport layer away from the anode,
    wherein the step of forming the perovskite light-emitting layer comprises:
        forming a first sublayer on a side of the hole transport layer away from the anode, with a raw material for forming the first sublayer comprising an inorganic perovskite material; and
        forming a second sublayer on a side of the first sublayer away from the anode, with a raw material for forming the second sublayer being an organic perovskite material,
    wherein the step of forming the perovskite light-emitting layer further comprises annealing the first sublayer at 70 to 200° C. after the step of forming the first sublayer.

2. The method of claim 1, wherein the first sublayer is formed by a solution process and the second sublayer is formed by a vacuum evaporation process.

3. The method of claim 2, wherein a raw material for forming the first sublayer by the solution process further comprises a passivation material and a solvent, with the solvent comprising at least one selected from dimethyl sulfoxide and dimethylformamide.

4. The method of claim 3, wherein the weight ratio of the inorganic perovskite material to the passivation material is from 19:1 to 4:1.

5. The method of claim 1, wherein the method further comprises:
    forming a hole injection layer on the side of the anode before forming the hole transport layer.

6. The method of claim 1, wherein the method further comprises:
    forming an exciton-blocking layer on the side of the perovskite light-emitting layer before forming the electron transport layer.

7. A method for preparing a light-emitting diode, comprising steps of:
    forming a hole transport layer on a side of an anode;
    forming a perovskite light-emitting layer on a side of the hole transport layer away from the anode;
    forming an electron transport layer on a side of the perovskite light-emitting layer away from the anode; and
    forming a cathode on a side of the electron transport layer away from the anode,
    wherein the step of forming the perovskite light-emitting layer comprises:
        forming a first sublayer on a side of the hole transport layer away from the anode, with a raw material for forming the first sublayer comprising an inorganic perovskite material; and
        forming a second sublayer on a side of the first sublayer away from the anode, with a raw material for forming the second sublayer being an organic perovskite material material,
    wherein the first sublayer is formed by a solution process and the second sublayer is formed by a vacuum evaporation process.

8. The method of claim 7, wherein a raw material for forming the first sublayer by the solution process further comprises a passivation material and a solvent, with the solvent comprising at least one selected from dimethyl sulfoxide and dimethylformamide.

9. The method of claim 8, wherein the weight ratio of the inorganic perovskite material to the passivation material is from 19:1 to 4:1.

10. The method of claim 7, wherein the method further comprises:
    forming a hole injection layer on the side of the anode before forming the hole transport layer.

11. The method of claim 7, wherein the method further comprises:
    forming an exciton-blocking layer on the side of the perovskite light-emitting layer before forming the electron transport layer.

* * * * *